United States Patent [19]

Cheung

[11] 4,430,669
[45] Feb. 7, 1984

[54] TRANSMITTING AND RECEIVING APPARATUS FOR PERMITTING THE TRANSMISSION AND RECEPTION OF MULTI-TIER SUBSCRIPTION PROGRAMS

[75] Inventor: William S. H. Cheung, Hong Kong, Hong Kong

[73] Assignee: Payview Limited, Kowloon, Hong Kong

[21] Appl. No.: 268,640

[22] Filed: May 29, 1981

[51] Int. Cl.³ .................... H04N 7/16; H04K 1/04
[52] U.S. Cl. .................... 358/122; 358/117; 358/123; 358/193.1
[58] Field of Search .............. 358/117, 122, 123, 84, 358/86, 193.1

[56] References Cited

U.S. PATENT DOCUMENTS

| | | | |
|---|---|---|---|
| 3,696,297 | 10/1972 | Otero | 455/4 |
| 3,886,302 | 5/1975 | Kosco | 358/86 |
| 3,968,327 | 7/1976 | Gregg | 358/86 |
| 4,008,369 | 2/1977 | Theurer et al. | 358/84 |
| 4,058,830 | 11/1977 | Guinet et al. | 358/86 |
| 4,068,264 | 1/1978 | Pires | 358/122 |
| 4,079,419 | 3/1978 | Siegle et al. | 358/117 |
| 4,163,254 | 7/1979 | Block et al. | 358/122 |
| 4,225,884 | 9/1980 | Block et al. | 358/122 |

Primary Examiner—S. C. Buczinski
Attorney, Agent, or Firm—Pollock, Vande Sande & Priddy

[57] ABSTRACT

During non-program hours, a subscription broadcast television station broadcasts in place of programming the time of a future special broadcast as well as other information to enable decoding circuitry of subscribers. The receiver at the subscriber's residence tunes during non-broadcast hours all subscription television broadcast frequencies, and compares the subscriber's identification number with information being broadcast. When a coincidence between the received identification number being broadcast, and a stored identification number is obtained, the time of the future special broadcast is stored in a memory. At the time of a subscription broadcast identified in the memory, tuning data is recalled from a memory for tuning the receiver to receive the special broadcast. The subscriber's decoding apparatus is also activated permitting descrambling of the special program broadcast.

12 Claims, 5 Drawing Figures

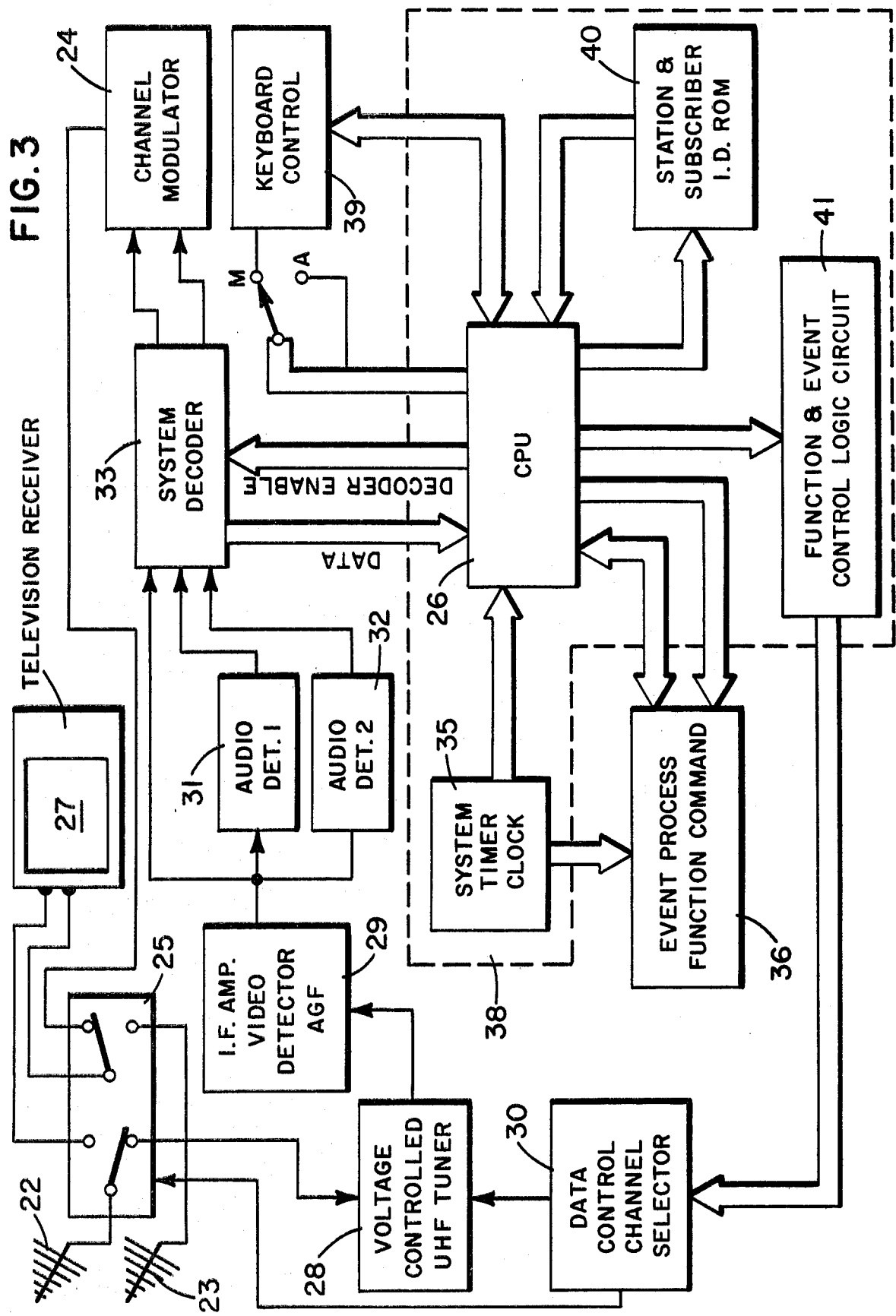

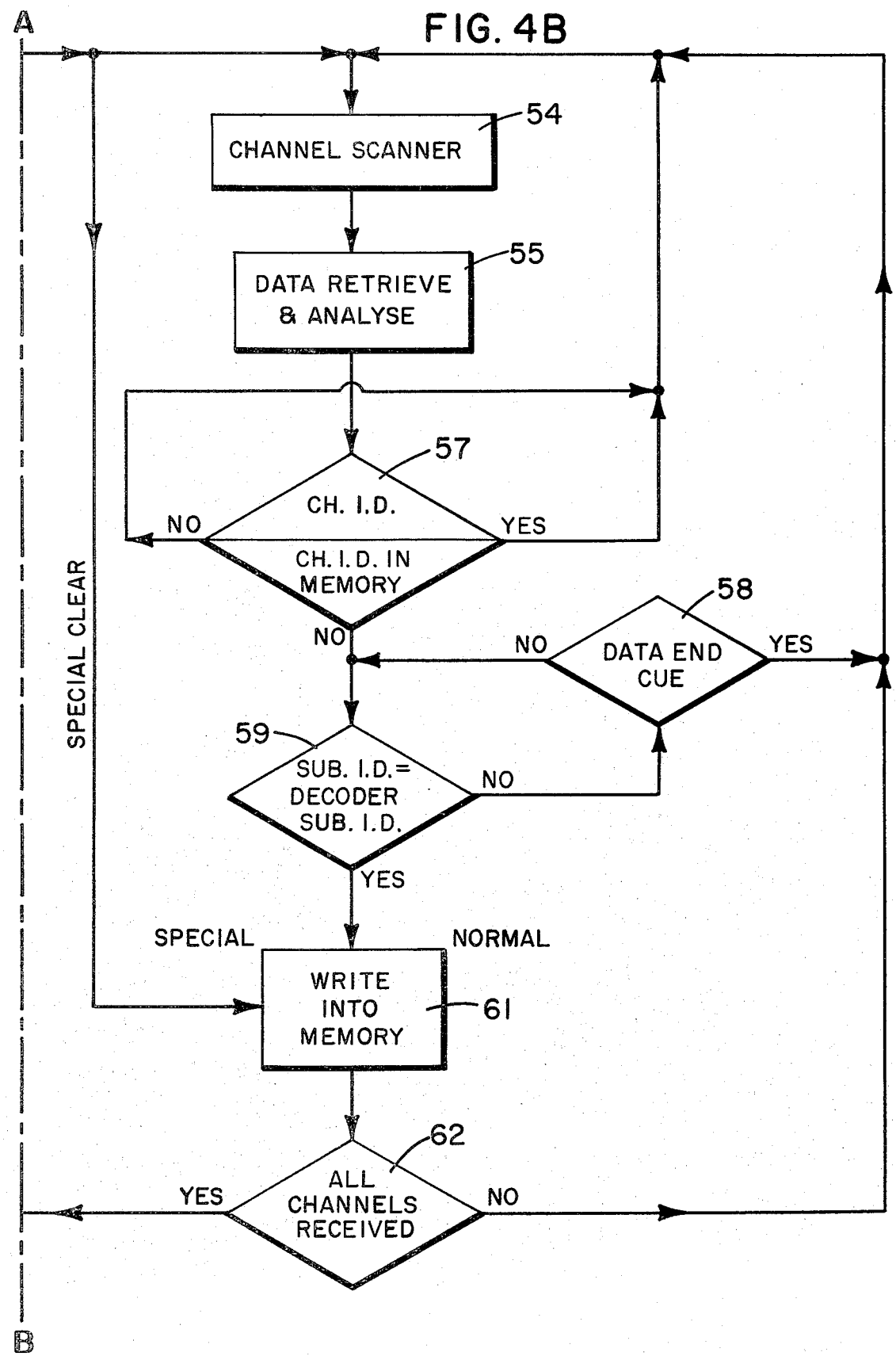

TRANSMITTING AND RECEIVING APPARATUS FOR PERMITTING THE TRANSMISSION AND RECEPTION OF MULTI-TIER SUBSCRIPTION PROGRAMS

BACKGROUND OF INVENTION

The present invention relates to direct broadcast subscription television systems and apparatus. Specifically, an apparatus and method are provided for receiving and decoding various classes of scrambled subscription broadcasts.

Subscription television service has been authorized by the Federal Communications Commission wherein subscribers in a listening area may receive television programs providing that a subscription to the program is purchased by individual viewers from the program originator. Scrambling of the broadcast signals is provided during the transmission of the broadcast to prohibit unauthorized television receiving stations from viewing the program material. Various scrambling techniques have been proposed in the art for providing security to the originating program so that only authorized subscribers may view the program material.

Some of the earlier proposed systems for scrambling subscription broadcasts include the transmission of a subscriber identification number with each of the transmitted broadcasts so that decoding equipment at a subscriber's television receiver will recognize the presence of an identification number being transmitted, and will activate or deactivate descrambling means at the receiver for restoring or prohibiting the scrambled video and audio signals to be conditioned whereby a television receiver will properly display the program material.

The above scrambling technique has been proposed for use with television stations which provide a basic periodic subscription service whereby individual television receivers have descrambling equipment which are capable of comparing a machine readable identification number, supplied to the subscriber at the time the subscription is purchased, with an identification number transmitted by the station during broadcasting of the scrambled program.

The capability of subscription television broadcasts can be greatly enhanced with a provision at the subscriber's television receiver for distinguishing between special broadcasts, which carry programs having an additional purchase price associated therewith over and above the basic subscription price, from regular subscription broadcasts. Feature films, sporting events, and special adult entertainment can then be provided by the broadcaster in such a system at an additional premium one-time charge resulting in at least two tiers of programming.

The present invention is directed to providing a system for permitting special programming to be implemented in addition to the basic subscription programming previously purchased by a subscriber.

SUMMARY OF THE INVENTION

It is an object of this invention to provide an apparatus and method for providing special programming in a subscription broadcast system.

It is a specific object of this invention to broadcast programming information in advance of a special program to enable authorized customers of subscription television services to receive a later broadcast of a special program.

These and other objects are accomplished by apparatus and methods in accordance with the present invention. Transmitting and receiving apparatus are provided to permit during non-broadcast hours the transmission and reception of special programming information as well as normal programming information to be used by authorized subscribers. During non-program hours, a subscription broadcast television station will broadcast in place of programming, the time of a future special broadcast, as well as other information to enable the decoding circuitry in receivers of those subscribers which are authorized to receive the special broadcast at the time of the special program broadcast. The receiver at the subscriber's residence will tune during non-broadcast hours all subscription television broadcast frequencies, and compare subscriber identification information being broadcast with a subscriber identification number previously supplied by the broadcaster, stored in machine readable form in the receiver. When a coincidence between a received identification number and a machine readable identification number occurs, program information identifying the future special program is stored in a memory for use by descrambling apparatus to enable the receiver decoding apparatus at the time of the broadcast of the special program. Additionally, authorization to receive normal subscription broadcasts is transmitted during downtime to identify and inhibit those subscribers who are not currently authorized to receive the normal subscription broadcast from receiving normal subscription broadcasts.

Each subscription broadcast station signal within the reception area of the subscriber is individually interrogated by apparatus in accordance with this invention during non-programming hours, and each time an identification number is received during the non-broadcast hours indicating that a special program has been requested by the subscriber, the time of broadcast of the special program as well as other identifying information, transmitted with the subscriber identification number, is stored in memory and recalled at the time of the special broadcast for tuning the frequency associated with the special broadcast.

Decoding of the special and normal scrambled broadcasts for both regular subscription and special broadcasts are provided to restore the video and in some cases audio to a television signal which may be displayed by a television receiver.

DESCRIPTION OF THE DRAWINGS

FIG. 3 is a block diagram of receiving apparatus for processing program and data broadcasts.

FIGS. 4A and 4B comprise a flow chart showing appropriate programming steps for the microprocessor of FIG. 3.

DESCRIPTION OF THE PREFERRED EMBODIMENTS

Figure 1:
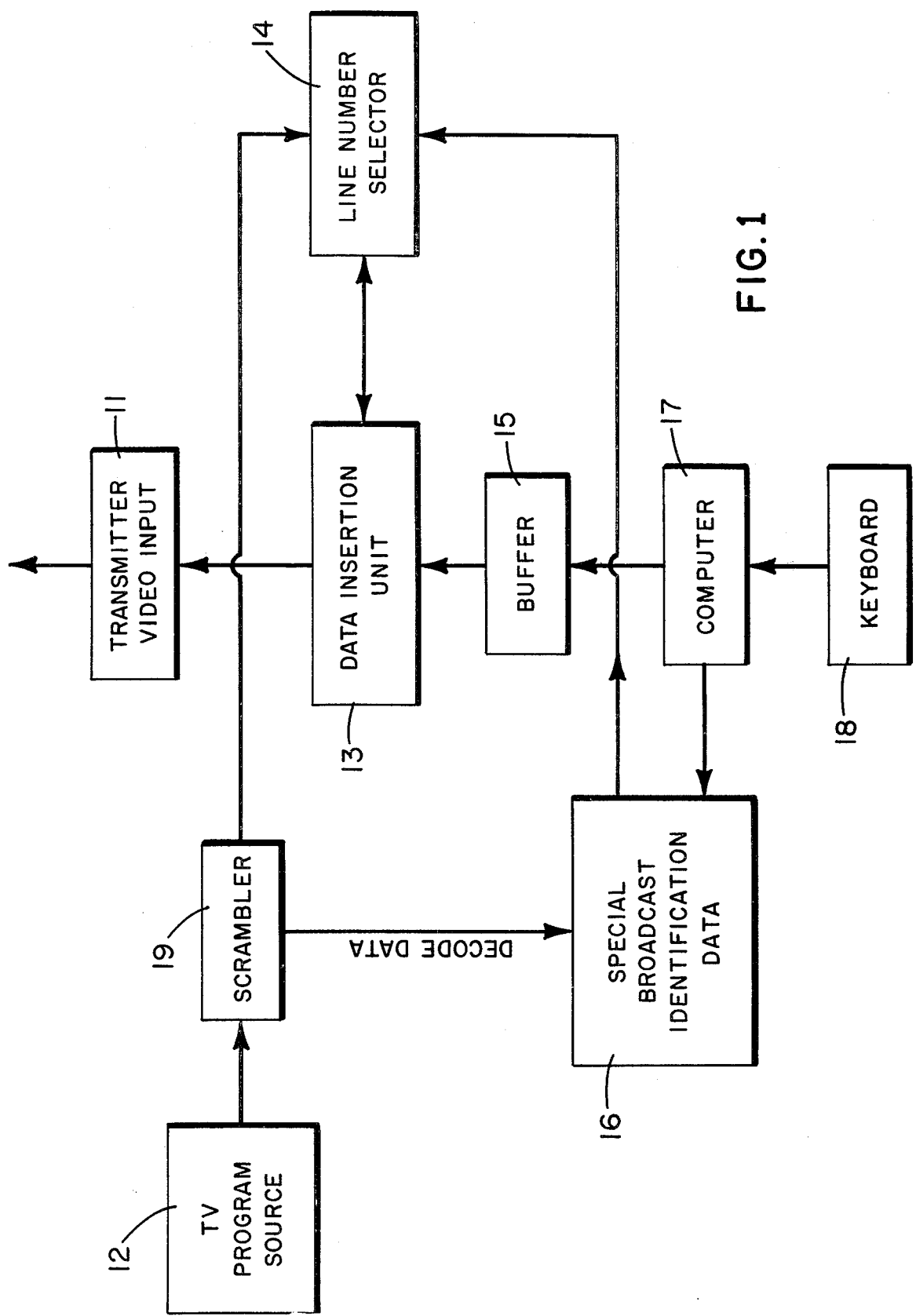
FIG. 1 is a block diagram showing transmitter apparatus for transmitting subscriber identification data during non-programming hours.

Table 1 is illustrative of the program formats which the present invention is capable of distinguishing thereby permitting additional subscription charges to be made for special programs over and above the regular basic monthly subscription programs.

TABLE 1

PROPOSED PROGRAM CLASSIFICATION FOR PAY TV SYSTEM

| Item | Description | Method of Charge | Ref. Code |
|---|---|---|---|
| 1. | Off-The-Air Normal Non-Subscription Programs | No Charge | A |
| 2. | Basic Monthly Subscription Programs | Monthly Subscription Charge | B |
| 3. | Optional Subscription Programs (TIERS) | | |
| | 3.1 Weekly Programs | Additional Charge at Weekly Basis | C1 |
| | 3.2 Bi-Weekly Programs | Additional Charge at Bi-Weekly Basis | C2 |
| | 3.3 Special Programs Series | Additional Charge at Per Series Basis | C3 |
| | 3.4 Non-Scheduled Special Programs | Additional Charge at Per Program Basis | C4 |

The first item described in Table 1 is the normal off-the-air non-subscription programs. These programs do not require any payment by the viewer and are designated by reference code A. Television apparatus for tuning these signals are well known and the direct tuning of these non-subscription programs can be readily accomplished.

The second item of Table 1 is a basic monthly subscription program which is charged to the subscriber on a monthly basis permitting unlimited viewing of the basic programs. Reference code B is assigned to this type of service which permits the subscriber to identify these programs from the transmitted broadcast signal. My copending U.S. patent application, Ser. No. 091,784, filed Nov. 14, 1979, now abandoned in favor of Ser. No. 134,185, filed Mar. 26, 1980, illustrates one type of basic monthly subscription program system. This system, which includes scrambling each field of the video signal in accordance with a randomly changing code, is used to keep non-subscribers from viewing an undistorted video signal. The binary number which defines the scrambling sequence of each field of video is sent during the vertical blanking interval after the normal vertical field pulses found in commercial television broadcast signals. The television receiving apparatus described in the aforementioned copending application, hereby incorporated by reference, determines during the vertical blanking interval of the received video signal whether or not the subscriber is identified by a number included in the vertical interval, and if the subscriber is in fact identified, the decoder of the television receiving apparatus is disabled and the broadcast to be de-scrambled in accordance with the aforementioned coded scrambling number remains scrambled. Only those subscribers not identified during the vertical blanking interval are authorized to receive these broadcasts and therefore have their descrambling means enabled.

The remaining entries of Table 1 are illustrative of subscription programming formats which would be available in accordance with the present invention. These include four additional charge program types which the subscriber elects on a weekly basis, bi-weekly basis, per series basis or on a non-schedule per program basis. Each of these types of programs carries with it an identifying reference code as shown.

The optional subscription programs are subscribed to in advance of the program broadcast. A subscriber enters his selection on a preprinted card which is mailed to the broadcaster, or by other means such as telephoning makes his selection known to the broadcaster in advance of the broadcast date.

Figure 2:
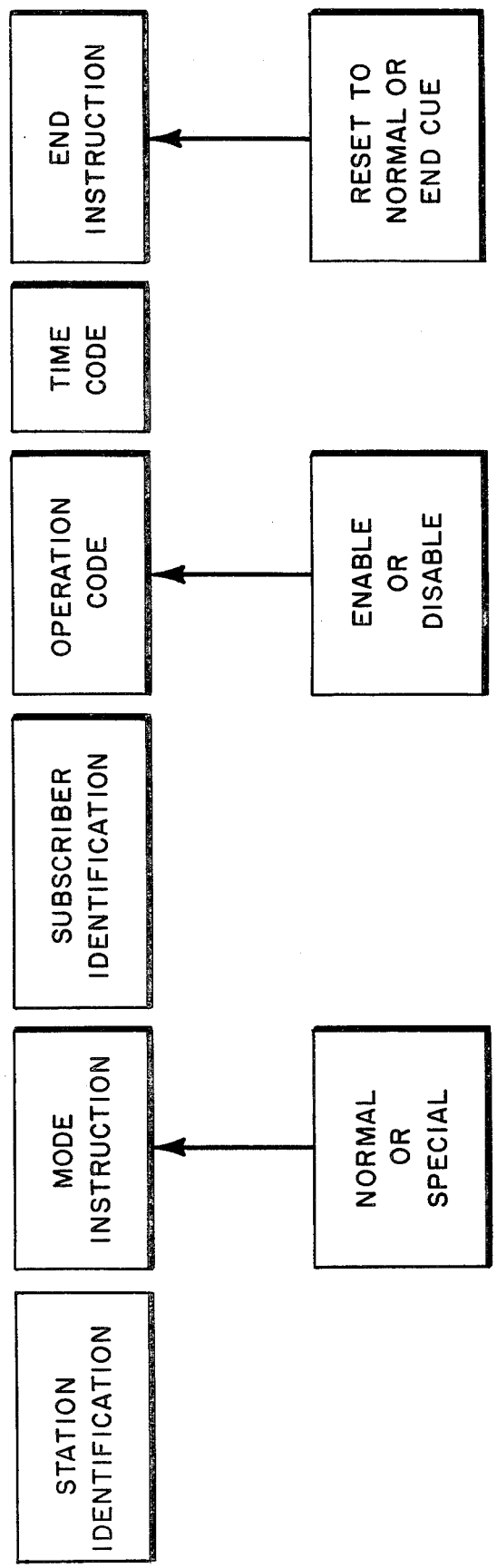
FIG. 2 illustrates the data broadcast during program and non-program hours.

The broadcaster, upon receiving notification of the selection of an optional subscription program by a monthly subscriber, enters into the computer data which will be broadcast during the non-programming hours. Referring to FIG. 2, this data is seen to comprise a serial stream of data including the station identification number, a mode instruction whether or not the mode is normal or special, subscription identification numbers of those subscribers eligible to receive the broadcast, an operation code associated with each subscriber identification number indicating that the subscriber's decoder should be enabled or disabled depending upon the status of his account, a time code indicating the time of the succeeding day in which the special broadcast is to be transmitted. The data stream is concluded with an end instruction which indicates that the data stream is concluded. Also during downtime, the broadcaster will broadcast data according to FIG. 2 which will identify those subscribers which are no longer authorized to receive normal broadcasts, i.e. basic monthly subscription programs. The identification numbers of these subscribers will have an operation code associated therewith which will disable the subscribers descrambling apparatus. New regular subscribers are also identified during downtime by transmitting their identification code in accordance with FIG. 2 with an Enable command.

Referring to FIG. 1, there is shown broadcasting apparatus which will broadcast the television program as well as the preprogram identification data shown in FIG. 2.

The apparatus of FIG. 1 includes a computer 17 with a keyboard entry 18. Subscribers who have elected to receive the special broadcast are identified by their preassigned identification number in computer 17. When all of such subscribers are identified and serially listed by identification number, along with the operation instruction, the data assembly is completed by indicating the station identification number, time for the future broadcast, and the end instruction as shown in FIG. 2. As to new basic monthly subscribers, or those being terminated, the time data is of course deleted. The assembled data stream is applied during non-broadcast hours to a buffer 15 which applies the data to a data insertion unit 13. The data insertion unit 13 is controlled by a line selector 14 known to those skilled in the art. The line selector 14 can be set up to insert the data in the field of a video signal at specific lines identified by the line selector 14. At present, in accordance with FCC policy, lines 15 and 16 of a video field are selected to carry data for transmission. It is to be recognized that the policy could be at some time changed to permit more lines or other numbered lines of the video signal to be used for carrying data, particularly during non-broadcast hours wherein programming is not normally carried out.

The data stream of FIG. 2 identifying all the subscribers eligible to receive the later to be broadcast special subscription program, as well as those who are new basic subscribers and those being terminated, it transmitted through transmitter 11 to the subscribers during the non-broadcast hours.

During broadcast time, the TV program source 12 information is supplied to scrambler 19 wherein in accordance with the aforementioned co-pending patent application, the video and audio signals may be scrambled. The output of the scrambler is applied to another input of the line selector 14 where it is applied to the data insertion unit 13. During program broadcasts the scrambled video and audio signal is applied from the data insertion unit 13 to the transmitter 11 in the normal manner. As described in the aforementioned co-pending patent application, the decoding identification number which identifies the particular lines of video signals in a given field which are scrambled, is inserted during the vertical blanking interval at lines 15 and 16. When the broadcast is a special broadcast, along with the decode identification data is sent a special broadcast identification data supplied by identification data generator 16. The ID data generator 16 receives the decode identification number and adds to this number two additional bits of information to indicate that the program is a special rather than a regular basic broadcast. The decode identification data and special broadcast ID data is also applied to the line selector 14 to be inserted during the vertical interval, particularly at lines 16 and 15. Thus, a scrambled television signal including the decode identification data and special mode identification data is transmitted via transmitter 11 on the same radio frequency carrier signal.

Thus, during non-broadcast hours, all the information necessary to identify the subscribers eligible to receive the special broadcast is transmitted along with data identifying a future special broadcast.

Referring now to FIG. 3, there is generally shown a television receiving apparatus for receiving broadcasts which are regular non-subscription, or which are subscription broadcasts in accordance with those transmitted by the apparatus of FIG. 1. The receiver shown in FIG. 3, is controlled by a microprocessor 38. During the so-called down time, i.e. when program broadcasting ends, the receiving apparatus is coupled to antennas 22, and 23 for receiving the UHF and VHF frequencies, respectively. An antenna switch 25 alternately connects the terminals of the television receiver to either the two antennas, 22, 23 or to the output of the channel modulator 34 under the control of the microprocessor 38.

The system timer clock 35 is continuously energized at all times including the time that the receiver is not receiving programs. The system timer clock 35 continuously supplies pulses on a periodic basis to the CPU 26 which is also continuously enabled by either battery or a system power supply to determine the time of day necessary for effectively controlling the television receiver.

Microprocessor 38 is programmed in a manner to be described such that during normal non-broadcasting hours, as determined from the pulses received from the system timer clock 35, antenna 22 will be connected to voltage controlled UHF tuner 28. A command from the microprocessor during this period is supplied to function and event control logic circuit, internal to the microprocessor 38, 41 which will decode the command to apply a control signal to data control channel selector 30. Also, the binary signal received from the function and event control logic circuit 41 is converted by the data control channel selector 30 into an analog tuning voltage for the voltage controlled UHF tuner 28. The application of a signal to data control channel selector 30 which includes at least one bit for indicating the non-broadcast period is applied to the antenna switch 25 to effectively connect antenna 22 to the voltage controlled UHF tuner 28.

During the non-broadcasting hours, microprocessor 38 is programmed to continuously scan voltage controlled UHF tuner 28 such that all channels which are identified in the station and subscriber identification ROM 40 are sequentially tuned in an effort to determine whether the subscriber's identification number is contained with the data broadcast by the various stations which offer normal subscription and special programming. When a subscriber initially subscribes to basic subscription programming, the station or a programming service supplies a ROM to the subscriber containing his assigned subscription identification number as well as the station identification number. Alternatively, the ROM 40 may be internal to the microprocessor 38 and programmed with the information in advance of the sale of the receiver. Therefore, it is anticipated that a subscriber who fully subscribes to all subscription programming in a given area will have a plurality of read only memories which are inserted by him at the time subscriptions are purchased in his receiving apparatus, or will have this information preprogrammed at the time of sale in microprocessor 38. Thus, at the time of purchase, the subscriber receives his identification number and the identification of the televison stations in the area where the sale is made.

During non-broadcast hours, as determined from the system timer and clock 35 and microprocessor 38, the radio broadcast frequencies are individually scanned by the voltage controlled UHF tuner 28. Microprocessor 38 provides output data which sequentially identifies each of the station signal frequencies for stations identified in the ROM 40. The coded tuning frequencies are individually applied to a function and event control logic 41 whereby data is produced which when applied to a data control and channel selector 30, produces an analog signal appropriate for tuning the voltage controlled tuner 28 to the identified frequency. The broadcast data is thereafter processed by the I.F. circuitry and video detector circuit 29 and system decoder 33 to provide base band data which is analyzed by the system decoder and microprocessor according to the following sequence.

The data shown in FIG. 2, transmitted during the non-programming hours, is continually compared with the station identification number, and subscriber identification number stored in the individual ROM's 40. The CPU 26 includes a sub routine in the program which compares the station identification numbers and subscriber identification numbers derived from I-F video detector circuit 29 and system decoder 33 with those stored in the station and subscriber ID ROM 40. When a coincidence between the two quantities transmitted and the two stored quantities is obtained, the time of the special broadcast which is included with the data being sent by the station during down time, is stored in the event process and function command RAM 36.

Each of the broadcast stations identified in ROM 40 are tuned in a subscriber's listening area until all stations have been interrogated to determine whether or not the subscriber's identification number appears in the non-program broadcast. When a data stream is received indicating that a new regular subscriber is authorized to receive the basic subscription broadcasts, his identification number is written into memory with the station identification number. When data is received indicating a subscriber is to be dropped, the previously stored identification number is erased thus disabling the reception of future regular subscription programming for a given station.

Following the interrogation of each broadcast station signal, control is retained by the CPU 26 until switch 63 is operated to enable keyboard control 39 to permit manual tuning of stations within the tuning range of the tuner to be accomplished by subscriber selection on the keyboard control 39.

During broadcast hours, keyboard control 39 permits the subscriber to identify a station by its channel number to effect tuning of the voltage controlled UHF tuner. The microprocessor 38 reads the keyboard control selection 39. The microprocessor 38 can convert the keyboard control selection into data for applying to the function and event control logic 41. The data is subsequently applied through the data control channel selector 35 to derive the proper tuning voltage for voltage control tuner 28.

When switch 63 is in an automatic mode, tuning of station channels identified in memory 36 will commence at the time specified along with the channel number in the memory. Step 67 in the programming cycle will enable tuning at the time identified in the memory of the associated channel number. In the event a subscriber who is authorized to view a special broadcast elects during the broadcast to view a regular subscription broadcast for any duration, whether temporary or not, he may change switch 63 to the manual mode and select another channel for viewing.

If the keyboard control 39 is set to receive a station which is a special broadcast station, the CPU 26 will read out the contents of the event process function and command RAM 36 to determine whether or not data is stored in the RAM which corresponds to the time the station is selected for tuning. In the event that the data is not stored in the RAM, at the time keyboard control 39 selects the station identified in the RAM 36, microprocessor 38 will prohibit descrambling of the special broadcast. This results, in a manner to further described, by analyzing the data received during the program broadcast. If the data sent during the vertical blanking interval indicates that the program is a special broadcast, decoding of the broadcast will not occur unless the time of the broadcast has been previously stored in RAM 36.

If the subscriber selects through keyboard control 39 a regular subscription broadcast station for viewing, RAM 36 is interrogated to determine that his identification number is present in that portion of RAM 36 reserved for basic subscription service identification. When verification of the contents of RAM 36 is completed, the decoder is enabled.

During broadcast hours, whether or not the program is special or regular subscription, the signals are processed with the voltage control tuner 28 and I.F. and video detector circuitry 29 to provide the scrambled signal to the sytem decoder 33. The present invention is contemplated for use with the scrambling techniques set forth in my earlier applications, Ser. Nos. 91,784 and 91,781 filed Nov. 19, 1979 and continuation-in-part application Ser. No. 134,185, filed Mar. 26, 1980, hereby incorporated by reference. In the system described in the copending patent applications, both audio and video scrambling is accomplished in a pseudo random manner, the scrambling code being sent during the vertical blanking interval. Audio detectors 31 and 32 will in accordance with these earlier filed applications filter the two audio subcarriers which alternately carry the audio signal detected by I.F. and video detector circuitry 29. Further, video processing, which includes reinverting scrambled lines of video in accordance with the random code received during the vertical interval, is accomplished with a system decoder 33 more particularly described in these earlier applications. The present invention although contemplated for use with these specifically described scrambling techniques, may of course be utilized in connection with other well known scrambling techniques known in the art.

The system decoder 33 is enabled by the microprocessor 38 during regular basic subscription broadcasts when the subscriber identification number is found by the microprocessor 26 to be coincident with a received subscriber identification number sent during the downtime and stored along with the station identification number in RAm 36. During the special broadcast time, the microprocessor 38 inhibits descrambling by the system decoder 33, when a special program is selected for viewing and, the corresponding time of broadcast is not found in RAM 36. Only when the correspondence is found between the time of broadcast as determined from the system timer and clock 35 and the time stored in the RAM 36, can the system decoder be enabled for receiving the selected broadcast.

The system decoder 33 provides the descrambled video and audio to a channel modulator 34. The channel modulator 34 frequency translates the video and audio to a radio frequency which is capable of being tuned by television receiver 27.

Programming for the microprocessor 38 to permit the reception, analyzing of data during non-broadcast time, and channel selection during broadcast time will now be described with respect to FIGS. 4A and 4B.

Figure 4A:
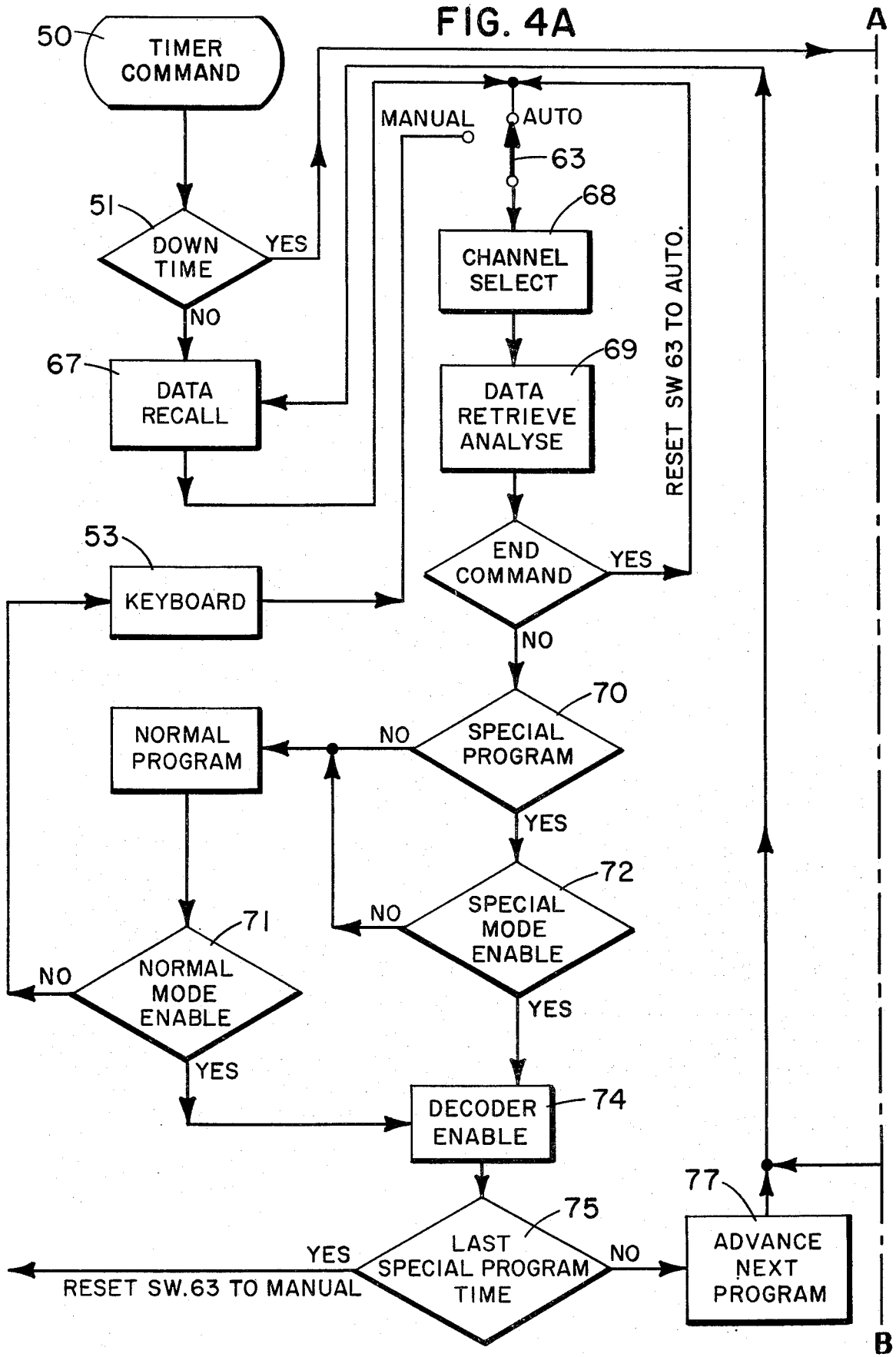

FIGS. 4A and 4B illustrate the programming steps necessary to effect operation of the apparatus shown in FIG. 3. Microprocessor 38 is preferably a Motorola MC 3870 single chip metal oxide silicon gate microcontroller. This microprocessor includes a system timer 35 and ROM 40 storage internal to the microprocessor 38. The first step in the operation of the processor is the timer command 50 which energizes the microprocessor 26 by applying the proper voltages thereto. The system timer lock 35, internal to the aforesaid microprocessor, continuously feeds pulses at a known periodic rate to the CPU 26 and in step 51 shown in FIG. 4, it is ascertained from these pulses whether or not it is broadcast time or non-broadcast time. During the non-program broadcasting hours, the frequencies of the channels identified in ROM 40 are scanned in step 54 by sequentially tuning tuner 28. The data being transmitted from each of the channels tuned by tuner 28 are analyzed in step 55. When the channel identification number broadcast during a non-program broadcast time is determined in step 57 to be equivalent to a channel identification number previously stored in memory 40, the contents of memory 36 are checked to determine if the channel identification number has been entered in RAM 26. If the channel identification number is not found in ROM 40, then the next channel is scanned and the data received is compared in analyze step 55 in the same manner with identification numbers previously stored in memory 40.

If the channel identification number is found in ROM 40 and not found in RAm 36, the received subscriber identification number is compared to a subscriber identification number in ROM 40. When a coincidence between these numbers is obtained, RAM 36 is addressed to enter the decoded data at a location which depends upon whether or not the data relates to a special or regular normal subscription service. If the data identifies a new regular subscriber, the new subscriber identification number is written into RAM 36 along with the station identification number. The new subscriber is thereafter enabled to receive regular basic subscription programs. If the data relates to a special broadcast, a different portion of RAM 36 is addressed, and the subscriber identification number, station identification number and time of the future special program broadcast is stored in step 61. If a regular subscriber is indicated by the data to be terminated from receiving future regular subscription broadcasts, RAM 36 is interrogated and the subscriber identification number previously entered is erased in step 61, thus prohibiting future descrambling of these broadcasts. During the interrogation of each data broadcast, the microprocessor 38 counts in step 62 all channels which have been individually tuned. When the total count is less than the number of stations identified by ROM 40, the channel scanning step 54 and subsequent analysis and memory writein steps 55 are continued until all channels have been tuned and received data analyzed. During the step of comparing the received subscriber identification numbers with the stored subscriber identification number in ROM 40, a DATA END detection step 58 is employed to detect the end of a broadcasters data stream. In the event the subscriber identification number is not found, the DATA END signal included with the broadcast is therefore used to advance the channel tuning in the event a subscriber identification number is not detected among the data broadcast.

The foregoing described programming steps which are carried out by the microprocessor 38 during non-programming hours tune each individual station identified in the station memory 40 and write into memory 36 the time and station identity of those special broadcasts which the subscriber is entitled to receive.

The keyboard control 39 when switch 63 is in the manual mode permits the subscriber to select either the special program broadcasts which are identified by the station and time of the future broadcast in memory 36 or to view other stations having basic subscription service which are also identified in RAM 36.

With switch 63 in the automatic mode, the stations having special programming identified in RAM 36 will automatically be tuned at the previously stored time stored in the RAM 36. In the automatic mode, each of the stations identified will be automatically tuned in step 68 when the stored time is equivalent to the real time indicated by the system timer and clock. If there are two or more special program scheduled for broadcast at the same time identified in RAM 36, the first station identification number recalled from RAM 36 will be tuned. The viewer will tune any remaining special broadcast occurring at the same time through the manual mode selections process.

When switch 63 is in the manual channel selection mode, and a special broadcast channel is selected on keyboard 39, data received during the vertical blanking interval is analyzed in step 69. If the data indicates that a program is ending, then switch 63 is placed into automatic mode again. If the END CUE data is not present, step 70 analyzed receives data to determine whether it is a special broadcast or basic subscription broadcast. If a special broadcast is indicated, step 72 will determine whether RAM 36 contains the time of the special broadcast and the station identification number. If so, the decoder is enabled in step 74.

When switch 63 is in the automatic mode, during the reception of a signal tuned in response to the retrieval of the earlier program data in memory 36, the intermediate frequency amplifier and video detection circuitry supplies the scrambled special broadcast to the system decoder 33 and to any appropriate audio detection networks 31 and 32. Along with the de-scrambling data sent during the program broadcast, a digital number is sent to indicate whether it is a special broadcast. This data is analyzed in step 69, and if a special broadcast identification code is detected in step 70 during the vertical interval of the program broadcast, a special mode enable data is provided by the microprocessor 38 to the system decoder only if the memory 36 contains special broadcast identification data corresponding to the time of receipt of the special identification code of step 70. In other words, the memory 36 must have been previously programmed with information regarding the broadcast being received to permit unscrambling of the video and audio signals thereby restoring a correct video signal for modulating on a signal within the pass band of the television receiver by modulator 34. In the event it is determined that the broadcast is not identified by previously stored data in any memory cell, the system switchs to normal mode permitting descrambling of normal subscription programs only.

When after tuning a station in accordance with data stored in memory 36 produces a special mode identification data from the system decoder 33 transmitted with the decoding data, enabling data 33b supplied to the system decoder enables descrambling of the received video signal in step 74. At the conclusion of the special program broadcast, the memory is interrogated to produce additional stations to be tuned. The special broadcast includes END CUE Data which when detected, initiates interrogation of memory 36 for additional pre stored special broadcast information. The time indicated by system timer 35 is again compared with the times stored in the memory 36 corresponding to previously subscribed special broadcasts. When time is equivalent, the station identified on the memory for this time is tuned.

After all the memory data is read from RAM 36, the end of the program finally viewed will change the system to the manual mode in step 75, resetting switch 63. At the beginning of the next downtime, the addresses available for storing special broadcast information is cleared permitting entry of new data.

The above sequence describes the programming steps for microprocessor 38 which will during the down time receive and preprogram memory 36 with special broadcast information, as well as read out of memory 36 the prerecorded special broadcast time and station identification information.

As was previously explained with respect to FIG. 3, the apparatus of FIG. 3 will permit the viewing of regular subscription program broadcast by accessing through keyboard control 39 a selected channel frequency shown as step 53.

When switch 63 is in the manual mode, the keyboard input is read in step 53 to detect whether or not a specific channel has been selected by the viewer. Channel select step 68 will, after interrogating the keyboard 39 of FIG. 3, convert the entry into a digital number specifying the tuning frequency of the selected channel number. The function and event control circuit 41 provides appropriate tuning data to the channel selector 30. Once tuner 28 is tuned in accordance with this data, the data being sent during the vertical blanking interval is retrieved in step 69 from the tuned channel signal. If during the vertical interval, data is received indicating that the program is not a special broadcast, step 70 will put the decoder in condition to receive normal basic subscription broadcasts. Step 71 will verify that RAM 36 contains subscriber and station identification numbers for the channel tuned. If the RAM 36 contain this data, the decoder is enabled in step 74. In the event that the program selected is a special broadcast, the contents of the memory 36 are as previously described analyzed to determine whether or not the subscriber is authorized to receive this special broadcast.

It is contemplated with this system that in areas where special broadcasts are being provided along with regular subscription broadcasts, an END CUE data signal will be transmitted at the conclusion of every broadcast whether special or normal regular subscription. The END CUE data appearing in the vertical interval of the signal being broadcast is used to switch control of the channel tuning into the special mode or automode channel tuning whereby the contents of memory 36 are once again analyzed to determine whether or not the subscriber is eligible to receive a special broadcast which commences at the time the regular broadcast is over.

Thus, there has been described with respect to one embodiment transmitting and receiving apparatus which permits individual pay television stations to transmit pre-programmed information identifying subscribers to special broadcasts to be offered at a premium subscription rate. The pre-programmed broadcast data is analyzed by the subscriber's receiving equipment. The authorized subscriber stores this data as to the time of the next special broadcast. Thus, only those who have previously subscribed to these special broadcasts can receive the broadcast.

What is claimed is:

1. A multichannel receiver for selectively tuning one of several pay television stations during programming hours which broadcast scrambled video signals, each of said stations broadcasting during non-programming hours related subscriber identification information and program identification information, comprising:
   a voltage controlled tuner for tuning the frequency of each of said stations in response to an operating voltage;
   a read only memory for storing tuning information identifying the frequency of each of said stations and a subscriber identification number;
   a Random Access Memory for storing received program identification information;
   a system clock for providing periodic timing pulses;
   video processing circuitry for removing and separating said video signals and information signals from a broadcast signal received by said tuner;
   a control processor having I/O parts connected to said memories, and video processing circuitry, said processor being connected to said clock, and during non-programming hours said processor being connected to continually and sequentially read out of said Read Only Memory tuning information for each of said television stations, said processor further comparing subscriber identification information provided by said video circuitry to subscriber identification data in said Read Only Memory each time a station frequency is tuned and upon coincidence thereof stores said related program identification information including status identification data and program time in said RAM at a specified address;
   means for addressing and reading out from said Random Access Memory said stored information during program broadcast time; and
   means for tuning the television receiver tuner in response to said read out information whereby said television receives a station signal identified by said stored information at a frequency and time.

2. The multichannel receiver of claim 1, further including means for descrambling video signals received from said video circuitry; and
   means for inhibiting the descrambling of said video signals in the absence of stored program information signal in said RAM relating to said video signals.

3. The multichannel receiver of claim 1, further comprising:
   a keyboard control means connected to said processor, said keyboard control means providing a signal to said processor, said signal identifying a previously stored information signal; and
   means for tuning said tuner to a frequency identified by said stored information signal.

4. A receiver for receiving subscription program broadcasts from a plurality of broadcast stations operating at different frequencies, each of said stations broadcasting at a specified time in advance of said program data identifying subscribers, said stations, and the time of broadcast of programs subscribed to by each subscriber comprising:
   a voltage controlled tuner for selectively tuning each of said broadcast stations' signals;
   a station and subscriber identification number memory, said memory having programmed therein tuning frequency data for each of said stations and a subscriber identification number;
   a system clock for providing an indication of said specified time;
   a processor means connected to said system clock and said memory, said processor sequentially reading out of said memory said tuning frequency data during said specified times;
   means for sequentially converting each of said tuning frequency data into a voltage for tuning said tuner whereby each of said station broadcast signals are sequentially tuned during said specified time;
   video processing circuitry connected to said tuner for removing data identifying subscribers and subscribed program information transmitted with each broadcast station signal which is tuned;
   means for comparing data removed by said video circuitry with said stored identification numbers;
   means for storing at a distinct address data from said video circuitry indicating the time of a subscribed program and the station identity broadcasting said program in response to an indication from said means for comparing; whereby data from each of said broadcast stations is stored at a different address upon an indication from said means for comparing that said subscriber is authorized to receive programs identified by said data;

means for reading out of said means for storing identifying data of the stored broadcast station identity at a broadcast time specified by said data in said means for storing; and means for generating a tuning voltage for tuning said tuner to the frequency of said broadcast station identified by said read out data at a time read out from said memory, whereby said tuner produces a scrambled video signal transmitted by said broadcast station.

5. The receiver of claim 2, further comprising a carrier frequency generator for providing a signal within the passband of a television receiver; and a modulator for modulating said signal with a video signal from said means for descrambling, whereby a television signal within the frequency passband of a television receiver is produced.

6. A self-programming apparatus for tuning multiple broadcast stations, said broadcast stations transmitting during nonbroadcast periods a subscriber identification number as well as program identification information indicating the time said subscriber is authorized to receive a scrambled broadcast program signal from said station comprising:

means for storing each of said numbers representing program information in a memory having an address corresponding to broadcast time identified by said program information;

means for addressing and reading out each of said stored numbers at a time specified by said numbers; and means for tuning said tuner to a frequency identified by said stored number.

7. The apparatus of claim 6, further comprising means for descrambling a video signal produced when said tuner is tuned to a frequency identified by said stored number.

8. The apparatus of claim 7, further comprising means for inhibiting descrambling of video signals in the absence of a correspondence between said stored identification number and a received identification number.

9. The receiver of claim 4, further comprising means for descrambling a signal produced by said tuner.

10. The receiver of claim 4, further comprising means for inhibiting descrambling of said signal in the absence of a signal from said means for comparing indicating that said subscriber is authorized to receive a program contained by said signal.

11. The apparatus of claim 9, further comprising frequency translation means for frequency translating a descrambled video signal into a signal within the radio frequency passband of a television receiver.

12. A method of providing multi-tier subscription broadcasts to a plurality of subscribers, said multi-tier broadcasts including broadcasts at a regular subscription price and special programs at an additional premium price, comprising:

transmitting in advance of a subscription broadcast data identifying each subscriber authorized to decode a later transmitted scrambled signal as well as the time of said later to be broadcast scrambled signal, and an identification number of the station to broadcast said later program signal;

demodulating at each of said subscribers location said data from said broadcast;

comparing at each of said subscriber's locations said broadcast data with a previously stored subscriber identification number and station identification information supplied by a program originator when a regular subscription is purchased;

storing data received from said advanced broadcast indicating the time of said future broadcast and the identification of said station broadcasting said later program signal when said transmitted subscriber and station identification numbers correspond to said stored identification numbers;

recalling said stored program time and station identification number at the time of said program broadcast;

demodulating said program broadcast signal at the time recalled from said stored data; and descrambling said demodulated program broadcast.

* * * * *

UNITED STATES PATENT AND TRADEMARK OFFICE
CERTIFICATE OF CORRECTION

PATENT NO. : 4,430,669

DATED : February 7, 1984

INVENTOR(S) : William S. H. Cheung

It is certified that error appears in the above-identified patent and that said Letters Patent is hereby corrected as shown below:

In claim 6, column 13, line 33, delete "said" and insert therefor --a--.

In column 13, line 8, delete "memory" and insert therefor --means for storing--.

Signed and Sealed this

Tenth Day of July 1984

[SEAL]

Attest:

Attesting Officer

GERALD J. MOSSINGHOFF

Commissioner of Patents and Trademarks